US012641327B2

(12) United States Patent
Que et al.

(10) Patent No.: US 12,641,327 B2
(45) Date of Patent: May 26, 2026

(54) ELECTRONIC DEVICE

(71) Applicant: VIVO MOBILE COMMUNICATION CO., LTD., Dongguan (CN)

(72) Inventors: Haibo Que, Dongguan (CN); Huasheng Zhu, Dongguan (CN); Kecheng Zhang, Dongguan (CN); Hongchao Zhao, Dongguan (CN); Kai Huang, Dongguan (CN); Fei Cao, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 899 days.

(21) Appl. No.: 17/746,907

(22) Filed: May 17, 2022

(65) Prior Publication Data

US 2022/0279061 A1 Sep. 1, 2022

Related U.S. Application Data

(63) Continuation of application No. PCT/CN2020/128015, filed on Nov. 11, 2020.

(30) Foreign Application Priority Data

Nov. 18, 2019 (CN) .......................... 201911129041.X

(51) Int. Cl.
H04N 23/00 (2023.01)
H04M 1/02 (2006.01)
H10K 59/80 (2023.01)

(52) U.S. Cl.
CPC .......... H04N 23/00 (2023.01); H04M 1/0264 (2013.01); H10K 59/8792 (2023.02)

(58) Field of Classification Search
CPC .. H04M 1/0264; H10K 50/865; H10K 50/868
See application file for complete search history.

(56) References Cited

U.S. PATENT DOCUMENTS

2018/0146084 A1 5/2018 Diebel

FOREIGN PATENT DOCUMENTS

CN 108845450 A 11/2018
CN 108957829 A 12/2018
(Continued)

OTHER PUBLICATIONS

International Search Report issued in corresponding International Application No. PCT/CN2020/128015, mailed Jan. 27, 2021, 6 pages.

(Continued)

*Primary Examiner* — Stephone B Allen
*Assistant Examiner* — Tamara Y. Washington
(74) *Attorney, Agent, or Firm* — IPX PLLC

(57) ABSTRACT

Disclosed is an electronic device including a display module and a camera module. The display module includes a first substrate and a second substrate stacked with each other, a cabling structure having a first optical hole, and a polarizer disposed on a side surface of the first substrate and being away from the second substrate. The camera module includes a camera body disposed with a light inlet hole and a light shielding layer having a second optical hole. The first optical hole, the second optical hole, and the light inlet hole are arranged in an optical axis direction of the camera module. Orthographic projections of both the first and second optical holes on a plane perpendicular to the optical axis direction are located in an orthographic projection of the light inlet hole on the plane perpendicular to the optical axis direction.

7 Claims, 1 Drawing Sheet

(56)     References Cited

FOREIGN PATENT DOCUMENTS

| CN | 110049223 | A |   | 7/2019  |   |            |
|----|-----------|---|---|---------|---|------------|
| CN | 209266408 | U |   | 8/2019  |   |            |
| CN | 209267626 | A |   | 8/2019  |   |            |
| CN | 110300246 | A | * | 10/2019 | .......... | H04M 1/0264 |
| CN | 110335890 | A |   | 10/2019 |   |            |
| CN | 209460528 | U |   | 10/2019 |   |            |
| CN | 110426878 | A | * | 11/2019 | ....... | G02F 1/133512 |
| CN | 209608699 | U |   | 11/2019 |   |            |
| CN | 110730293 | A |   | 1/2020  |   |            |
| CN | 110784635 | A |   | 2/2020  |   |            |
| CN | 110784636 | A |   | 2/2020  |   |            |
| CN | 110827672 | A |   | 2/2020  |   |            |
| JP | 2013232040 | A |  | 11/2013 |   |            |

OTHER PUBLICATIONS

First Office Action issued in related Chinese Application No. 201911129041.X, mailed Feb. 1, 2021, 8 pages.
Extended European Search Report issued in related European Application No. 20889742.1, mailed Dec. 2, 2022, 7 pages.

\* cited by examiner

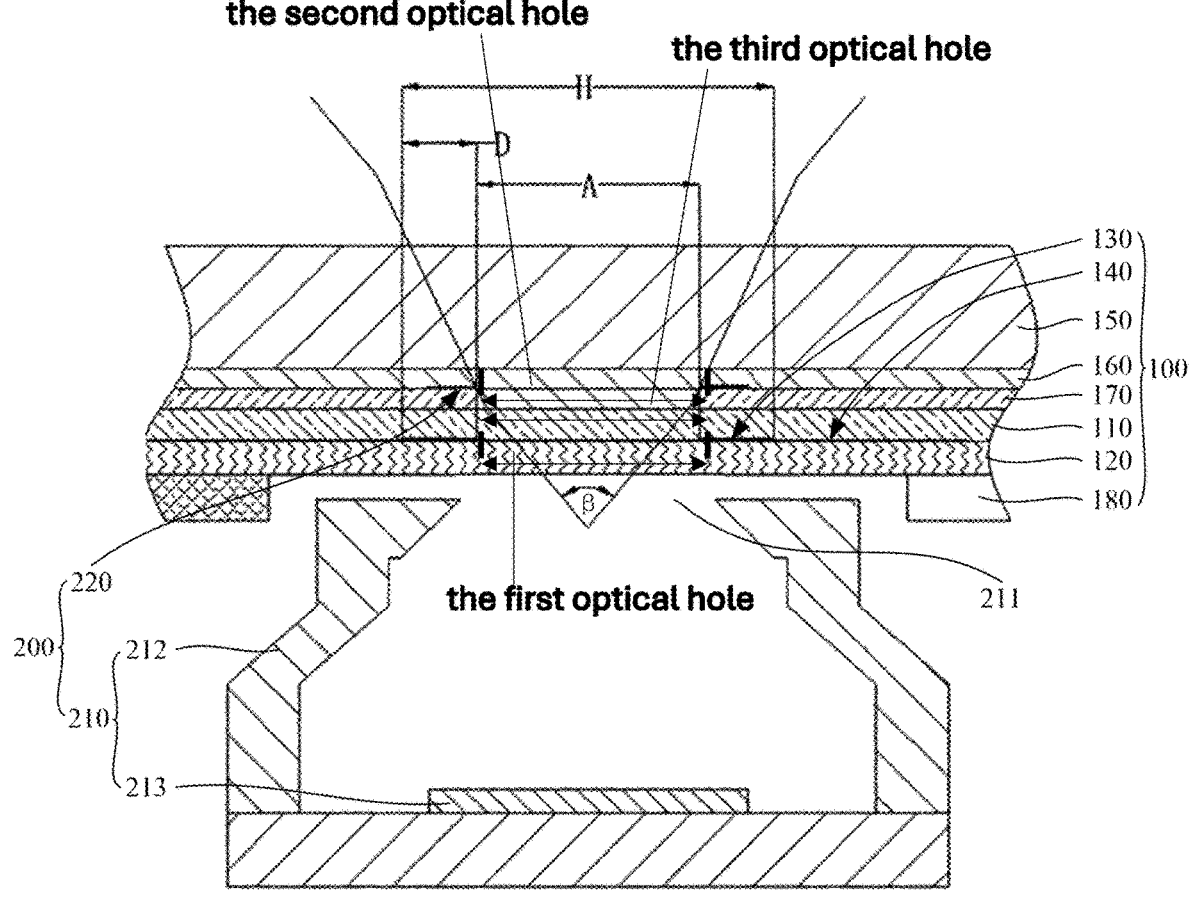
the second optical hole
the third optical hole
the first optical hole

ELECTRONIC DEVICE

CROSS-REFERENCE TO RELATED APPLICATIONS

This application is a continuation of International Application No. PCT/CN2020/128015, filed Nov. 11, 2020, which claims priority to Chinese Patent Application No. 201911129041.X, filed Nov. 18, 2019. The entire contents of each of the above-referenced applications are expressly incorporated herein by reference.

TECHNICAL FIELD

The present disclosure relates to the field of communications device technologies, and in particular, to an electronic device.

BACKGROUND

Electronic devices such as smartphones and tablets have become indispensable in people's daily life. The screen-to-body ratio of an electronic device is an important factor that affects user experience. Therefore, how to improve the screen-to-body ratio of the electronic device has become a design direction that a person skilled in the art pays most attention to.

To improve a screen-to-body ratio of an electronic device in a related technology, a camera module may be disposed below a display module, and an optical hole is disposed on the display module, to ensure that the camera module can work normally. The camera module mainly includes components such as a bracket, a lens assembly, and a light shielding layer. The lens assembly is mounted in the bracket, the light shielding layer is mounted on the bracket, and the light shielding layer is located above the lens assembly.

Because there is a distance between the light shielding layer and the display module, an optical opening provided on the display module needs to be greater than an inner diameter of the light shielding layer. In addition, there is an assembly error between the display module and the camera module. Therefore, when a hole is disposed on the display module, this assembly error needs to be considered to further expand a size of the optical hole. Therefore, in the related technology, an optical hole provided on the display module is relatively large, and consequently, a screen-to-body ratio of an electronic device is relatively small.

SUMMARY

The present disclosure provides an electronic device, including:

a display module, including a first substrate, a second substrate, a cabling structure, and a polarizer, the first substrate and the second substrate are stacked, the cabling structure is disposed on a side surface of the second substrate that faces the first substrate, a first optical hole is disposed on the cabling structure, and the polarizer is disposed on a side surface of the first substrate that is away from the second substrate; and a camera module, including a camera body and a light shielding layer, a light inlet hole is disposed on the camera body, the second substrate is located between the first substrate and the camera body, the light shielding layer is disposed on a side of the polarizer that is away from the first substrate, and a second optical hole is disposed on the light shielding layer; where the first optical hole, the second optical hole, and the light inlet hole are arranged in an optical axis direction of the camera module, and both an orthographic projection of the first optical hole on a plane perpendicular to the optical axis direction and an orthographic projection of the second optical hole on the plane perpendicular to the optical axis direction are located in an orthographic projection of the light inlet hole on the plane perpendicular to the optical axis direction.

The technical solutions used in the present disclosure can achieve the following beneficial effects:

In the electronic device disclosed in the present disclosure, the light shielding layer of the camera module is disposed on a side of the polarizer that is away from the first substrate. In this design, in one aspect, a distance between the light shielding layer and the display module is approximately zero, so that the first optical hole may be smaller. On the other hand, there is no assembly error between the display module and the light shielding layer. Therefore, the assembly error does not need to be considered when the first optical hole is disposed, and a size of the first optical hole can be further reduced, so that a screen-to-body ratio of the electronic device is higher.

BRIEF DESCRIPTION OF DRAWINGS

The accompanying drawings described herein are used to provide further understanding of the present disclosure and constitute a part of the present disclosure. The exemplary embodiments of the present disclosure and descriptions thereof are used to explain the present disclosure, and do not constitute an undue limitation on the present disclosure. In the accompanying drawings:

FIG. 1 is a sectional view of a partial structure of an electronic device disclosed in an embodiment of the present disclosure.

DETAILED DESCRIPTION

To make the objects, technical solutions, and advantages of the present disclosure clearer, the following clearly describes the technical solutions of the present disclosure with reference to specific embodiments of the present disclosure and corresponding accompanying drawings. Apparently, the described embodiments are only some rather than all embodiments of the present disclosure. Based on the embodiments of the present disclosure, all other embodiments obtained by a person of ordinary skill in the art without creative efforts fall within the protection scope of the present disclosure.

The technical solutions disclosed in the embodiments of the present disclosure are described in detail below with reference to the accompanying drawings.

As shown in FIG. 1, an embodiment of the present disclosure discloses an electronic device, and the electronic device may specifically include a display module 100 and a camera module 200.

The display module 100 may specifically include a first substrate 110, a second substrate 120, and a cabling structure 130. The first substrate 110 and the second substrate 120 are stacked, and the cabling structure 130 is disposed on a side surface of the second substrate 120 that faces the first substrate 110. Both the first substrate 110 and the second substrate 120 may be glass plates, and a thin-film transistor may be disposed on the second substrate 120. The cabling structure 130 may be an annular structure. A first optical hole is disposed on the cabling structure 130, and the first optical hole may be used for light to pass through, so that light in an external environment can enter the camera module 200. The display module 100 may further include a light emitting part 140, a transparent cover 150, an optical clear adhesive 160, a polarizer 170, and a foam 180. The light emitting part 140 may be disposed between the first substrate 110 and the second substrate 120, and the light emitting part 140 may be an organic light emitting layer. The polarizer 170 may be disposed on a side surface of the first substrate 110 that is away from the second substrate 120. The transparent cover 150 is located on a side of the first substrate 110 that is away from the second substrate 120, and the transparent cover 150 may be connected to the polarizer 170 by using the optical clear adhesive 160. The foam 180 may be disposed on a side of the second substrate 120 that is away from the first substrate 110. The foam 180 may be bonded to the second substrate 120, and an avoidance hole may be disposed on the foam 180. At least a part of the camera module 200 may be located in the avoidance hole, to prevent stray light in the display module 100 from affecting normal operation of the camera module 200, and reduce space occupied by the camera module 200, thereby reducing a thickness of the electronic device.

The camera module 200 specifically includes a camera body 210 and a light shielding layer 220, a light inlet hole 211 is disposed on the camera body 210, the second substrate 120 is located between the first substrate 110 and the camera body 210, the light shielding layer 220 is disposed on a side of the polarizer 170 that is away from the first substrate 110, and a second optical hole is disposed on the light shielding layer 220. The camera body 210 may specifically include a bracket 212, a lens assembly, and a light sensing chip 213. The lens assembly is disposed on the bracket 212, and the lens assembly may include lenses such as a convex lens and a concave lens, to implement effects such as light convergence. The light sensing chip 213 may be disposed in the bracket 212. The light sensing chip 213 has a light sensing area used for light sensing, and the light sensing chip 213 may convert an optical signal into an electrical signal, to obtain corresponding image information. The second light hole herein can also enable light to pass through, so that light in an external environment can enter the camera module 200 and reach the light sensing area of the light sensing chip 213, thereby implementing a shooting function.

Both the cabling structure 130 and the light shielding layer 220 may play a role of shielding light. The first optical hole, the second optical hole, and the light inlet hole 211 are arranged in an optical axis direction of the camera module 200. Therefore, light in the external environment can successively pass through the second optical hole and the first optical hole, and finally pass through the optical hole 211 to enter the camera module 200, so that the camera module 200 can implement a shooting function. Both an orthographic projection of the first optical hole on a plane perpendicular to the optical axis direction of the camera module 200 and an orthographic projection of the second optical hole on the plane perpendicular to the optical axis direction are located in an orthographic projection of the light inlet hole 211 on the plane perpendicular to the optical axis direction. In other words, when the camera module 200 is viewed in the optical axis direction, both an outline size of the first optical hole and an outline size of the second optical hole are less than an outline size of the light inlet hole 211. A size of the optical entry hole 211 is slightly larger. Such setting does not affect a screen-to-body ratio of the display module 100, and it can be ensured that as much light in the external environment enters the camera module 200 as possible. However, the first optical hole and the second optical hole affect the screen-to-body ratio of the display module 100. Therefore, on a premise that a shooting requirement of the camera module 200 is met, the first optical hole and the second optical hole may be disposed as small as possible, to reduce occupation rate of a display area by the cabling structure 130 and the light shielding layer 220, thereby improving a screen-to-body ratio of the electronic device.

In the foregoing electronic device, the light shielding layer 220 of the camera module 200 is disposed on the display module 100. In this design, in one aspect, a distance between the light shielding layer 220 and the display module 100 is approximately zero, so that the first optical hole may be smaller. On the other hand, there is no assembly error between the display module 100 and the light shielding layer 220. Therefore, the assembly error does not need to be considered when the first optical hole is disposed, and a size of the first optical hole can be further reduced, so that a screen-to-body ratio of the electronic device is higher. In addition, after the size of the first optical hole is reduced, appearance quality of the electronic device is improved, and user experience is accordingly improved.

In an embodiment, a third optical hole is provided on the polarizer 170, and the third light hole may be used to enable light to pass through, to improve light transmittance of an area corresponding to the camera module 200, thereby improving shooting quality of the camera module 200. An orthographic projection of the third optical hole on the plane perpendicular to the optical axis direction overlaps the orthographic projection of the second optical hole on the plane perpendicular to the optical axis direction. In this case, a part of the optical clear adhesive 160 may extend into the third optical hole and the second optical hole, to fill the third optical hole and the second optical hole. Therefore, the part of the optical clear adhesive 160 may be in contact with a side surface of the first substrate 110 that is away from the second substrate 120, and is connected to the first substrate 110, so that structural strength of the display module 100 is higher. More importantly, in a process of processing the display module 100, positions of the light shielding layer 220 and the polarizer 170 may refer to each other, so that fast molding of the display module 100 is implemented, and molding efficiency of the display module is improved. In addition, an edge formed after the third optical hole is disposed on the polarizer 170 is aligned with an edge formed after the second optical hole is disposed on the light shielding layer 220. On the one hand, molding quality of the light shielding layer 220 can be ensured, and on the other hand, the light shielding layer 220 can be as close to a center line of the third optical hole as possible, thereby reducing a size of the light shielding layer 220, so that costs of the light shielding layer 220 are reduced. In addition, a large size of the light shielding layer 220 can be prevented from increasing a part of the display module 100 that cannot be used for display, thereby improving the screen-to-body ratio of the electronic device.

As described above, the first optical hole and the second optical hole affect the screen-to-body ratio of the display module 100. Therefore, the first optical hole and the second optical hole may be disposed as small as possible. In an embodiment, the orthographic projection of the first optical hole on the plane perpendicular to the optical axis direction of the camera module 200 may overlap the orthographic projection of the second optical hole on the plane perpendicular to the optical axis direction. In other words, a shape of the first optical hole is the same as a shape of the second optical hole, and sizes of the first optical hole and the second optical hole are the same. In this setting, both the sizes of the first optical hole and the second optical hole may be as small as possible. In addition, when the display module 100 is molded, relative positions of the first optical hole and the second optical hole may refer to each other, thereby facilitating processing of the display module 100.

In this embodiment of the present disclosure, an outer contour shape of the cabling structure 130 and an outer contour shape of the light shielding layer 220 may be flexibly set. For example, the outer contour shape may be rectangular, circular, or oval. In addition, a shape of the first optical hole and a shape of the second optical hole may also be flexibly selected, for example, may be a rectangular hole, a circular hole, or an oval hole. In an embodiment, considering that a shape of a field of view range of the camera touch group 200 is generally circular, to adapt to the camera module 200, and further improve the screen-to-body ratio of the electronic device, both the cabling structure 130 and the light shielding layer 220 may be set to annular structures. In this case, a radial width of the light shielding layer 220 may be less than a radial width of the cabling structure 130, thereby preventing a case in which the radial width of the light shielding layer 220 is excessively large and a light shielding area is excessively large, thereby achieving the foregoing objective.

As shown in FIG. 1, H=A+D*2, where H is a size of a hole that cannot be used for display on an external surface of the display module 100, A is an aperture of the second optical hole (or an aperture of the first optical hole), and D is a width of the cabling structure 130. Because an angle of view β of the camera module 200 is a fixed value, A is basically a fixed value, and D is basically a fixed value. In this case, a size of H is not affected by factors such as an assembly error, and therefore, H may be set to be smaller.

To improve a shooting effect of the camera module 200, a distance between a focus of the camera body 210 and the light shielding layer 220 in the optical axis direction may be a preset value. In other words, when a position of the light shielding layer 220 changes, a position of the camera body 210 changes, to ensure that a focus of the camera body 210 keeps at a position matching the light shielding layer 220, thereby improving the shooting effect. In this embodiment of the present disclosure, because the light shielding layer 220 moves up to the display module 100, a distance between the camera body 210 and the display module 100 can be further reduced, so that distribution of the display module 100 and the camera module 200 is more compact, and therefore, it is more conducive to component stacking in the electronic device.

The light shielding layer 220 is molded in multiple implementations. In an embodiment, the light shielding layer 220 may be molded by using a film coating process. In other words, the light shielding layer 220 may be a film-coated structure. Such a film-coated structure is easy to be molded, and the formed light shielding layer 220 has a relatively small thickness, thereby facilitating control of a thickness of the electronic device.

Certainly, the light shielding layer 220 may also be a printed structure. In other words, the light shielding layer 220 may be formed on a side of the polarizer 170 that is away from the first substrate 110 by using a printing process. This manner also has advantages of being easy to implement and a formed light shielding layer 220 has a relatively small thickness.

When the electronic device is assembled, alignment fixing between the light shielding layer 220 and the camera body 210 may be implemented in a manner such as precise positioning of a Charge-coupled Device (CCD) camera and dynamic alignment adjustment of a micro motor-driven camera module 200. Therefore, relative position precision of the light shielding layer 220 and the camera body 210 is higher. Therefore, an imaging effect of the camera module 200 is ensured, and a size of the first optical hole is increased without considering an alignment error, thereby improving the screen-to-body of the electronic device.

The electronic device disclosed in the embodiments of the present disclosure may be a smartphone, a tablet computer, an e-book reader, or a wearable device. Certainly, the electronic device may also be another device, which is not limited in the embodiments of the present disclosure.

The foregoing embodiments of the present disclosure focus on describing differences between the embodiments, and different optimization features of the embodiments may be combined to form better embodiments provided that they are not contradictory. Considering brevity, details are not described herein again.

The foregoing descriptions are merely embodiments of the present disclosure, and are not intended to limit the present disclosure. For a person skilled in the art, various changes and variations may be made in the present disclosure. Any modification, equivalent replacement, and improvement made in the spirit and principles of the present disclosure shall be included in the scope of the claims of the present disclosure.

What is claimed is:

1. An electronic device, comprising:
a display module, wherein the display module comprises a first substrate, a second substrate, a cabling structure, and a polarizer, the first substrate and the second substrate are stacked, the cabling structure is disposed on a side surface of the second substrate that faces the first substrate, a first optical hole is disposed on the cabling structure, and the polarizer is disposed on a side surface of the first substrate that is away from the second substrate; and
a camera module, wherein the camera module comprises a camera body and a light shielding layer, a light inlet hole is disposed on the camera body, the second substrate is located between the first substrate and the camera body, the light shielding layer is disposed on a side of the polarizer that is away from the first substrate, and a second optical hole is disposed on the light shielding layer;
wherein the first optical hole, the second optical hole, and the light inlet hole are arranged in an optical axis direction of the camera module, both an outline size of the first optical hole and an outline size of the second optical hole are less than an outline size of the light inlet hole, and both an orthographic projection of the first optical hole on a plane perpendicular to the optical axis direction and an orthographic projection of the second optical hole on the plane perpendicular to the optical axis direction are located in an orthographic projection of the light inlet hole on the plane perpendicular to the optical axis direction.

2. The electronic device according to claim 1, wherein a third optical hole is disposed on the polarizer, and an orthographic projection of the third optical hole on the plane perpendicular to the optical axis direction overlaps the orthographic projection of the second optical hole on the plane perpendicular to the optical axis direction.

3. The electronic device according to claim 1, wherein the orthographic projection of the first optical hole on the plane perpendicular to the optical axis direction overlaps the orthographic projection of the second optical hole on the plane perpendicular to the optical axis direction.

4. The electronic device according to claim 3, wherein both the cabling structure and the light shielding layer are annular structures, and a radial width of the light shielding layer is less than a radial width of the cabling structure.

5. The electronic device according to claim 1, wherein a distance between a focus of the camera body and the light shielding layer in the optical axis direction is a preset value.

6. The electronic device according to claim 1, wherein the light shielding layer is a film-coated structure.

7. The electronic device according to claim 1, wherein the light shielding layer is a printed structure.

* * * * *